(12) United States Patent
Salman et al.

(10) Patent No.: US 7,164,185 B1
(45) Date of Patent: Jan. 16, 2007

(54) SEMICONDUCTOR COMPONENT AND METHOD OF MANUFACTURE

(75) Inventors: Akram A. Salman, Sunnyvale, CA (US); Stephen G. Beebe, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 315 days.

(21) Appl. No.: 10/770,629

(22) Filed: Feb. 2, 2004

(51) Int. Cl.
*H01L 29/00* (2006.01)

(52) U.S. Cl. .............................. 257/546; 257/E27.047
(58) Field of Classification Search ................ 438/14; 257/546
See application file for complete search history.

(56) References Cited

U.S. PATENT DOCUMENTS

| | | | |
|---|---|---|---|
| 4,560,583 A * | 12/1985 | Moksvold | 438/11 |
| 4,989,057 A * | 1/1991 | Lu | 257/357 |
| 4,990,802 A | 2/1991 | Smooha | |
| 5,181,092 A | 1/1993 | Atsumi | |
| 5,218,222 A | 6/1993 | Roberts | |
| 5,266,156 A | 11/1993 | Nasr | |
| 5,485,095 A | 1/1996 | Bertsch et al. | |
| 5,717,559 A * | 2/1998 | Narita | 361/56 |
| 5,719,733 A | 2/1998 | Wei et al. | |
| 5,801,065 A | 9/1998 | Rizvi et al. | |
| 5,901,022 A | 5/1999 | Ker | |
| 6,137,338 A | 10/2000 | Marum et al. | |
| 6,249,413 B1 | 6/2001 | Duvvury | |
| 6,340,833 B1 * | 1/2002 | Liu et al. | 257/536 |
| 6,437,407 B1 * | 8/2002 | Ker et al. | 257/357 |
| 6,566,717 B1 | 5/2003 | Jung | |
| 6,621,404 B1 | 9/2003 | Banerjee | |
| 6,732,422 B1 * | 5/2004 | Thei et al. | 29/610.1 |
| 2002/0039825 A1 * | 4/2002 | Kawazoe et al. | 438/296 |
| 2002/0090787 A1 * | 7/2002 | Chan et al. | 438/300 |
| 2002/0115259 A1 * | 8/2002 | Maimon et al. | 438/382 |
| 2003/0123207 A1 * | 7/2003 | Toyoshima | 361/104 |
| 2004/0164355 A1 * | 8/2004 | Litwin et al. | 257/355 |

FOREIGN PATENT DOCUMENTS

| | | | |
|---|---|---|---|
| JP | 05090521 A | * | 4/1993 |
| WO | WO003021737 | * | 3/2003 |

OTHER PUBLICATIONS

Jiju Antony, Design of Experiment, 2003, Butterworth-Heinemann, Chapters 1-2.*
P. Leroux and M. Steyaert, High-performance 5.2 Ghz LNA with on-chip inductor to provide ESD protection, Electronics Letters, Mar. 29, 2001, vol. 37, No. 7, pp. 467-469.
C. Richier, P. Salome, et al., Investigation on Different ESD Protection Strategies Devoted to 3.3 V RF Applications (2 Ghz) in a 0.18 um CMOS Process, EOS/ESD Symposium, pp. 251-259.

* cited by examiner

*Primary Examiner*—G. William Baumeister
*Assistant Examiner*—Matthew L. Reames
(74) *Attorney, Agent, or Firm*—Farjami & Farjami LLP

(57) ABSTRACT

A semiconductor component having a tuned variable resistance resistor and a method for manufacturing the tuned variable resistance resistor. A semiconductor process for manufacturing a semiconductor component is selected. For the selected process, the tuned variable resistance resistor is characterized to determine the maximum stress current as a function of the width of the tuned variable resistance resistor. Then, for a given width and maximum stress current, the voltages across the resistors are characterized as a function of length. A tuned variable resistance resistor having a length and width capable of sustaining a predetermined maximum stress current is integrated into a semiconductor component. The semiconductor component may include protection circuitry designed in accordance with the Human Body Model, the Charge Device Model, or both.

27 Claims, 2 Drawing Sheets

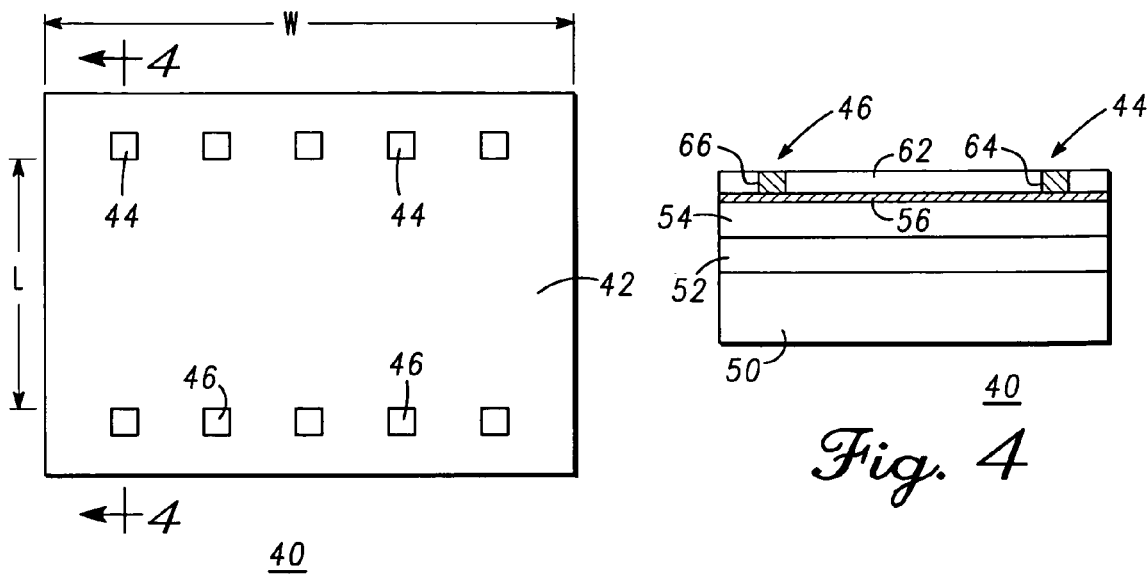
Fig. 3
Fig. 4
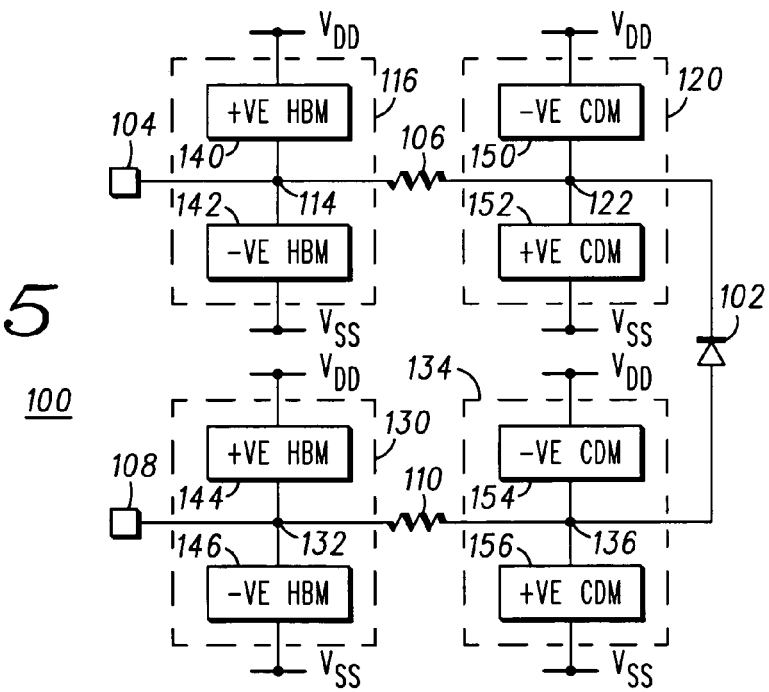
Fig. 5
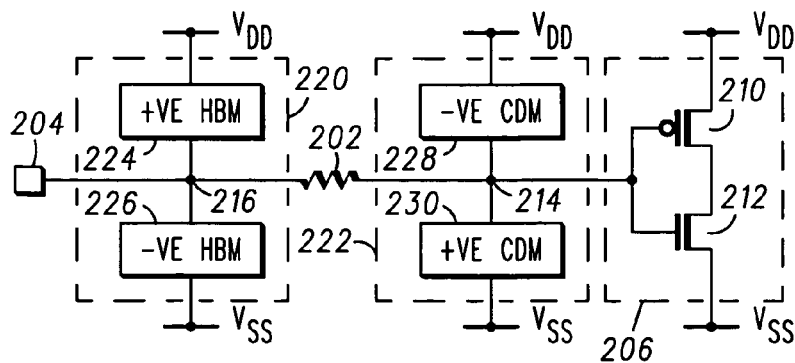
Fig. 6

SEMICONDUCTOR COMPONENT AND METHOD OF MANUFACTURE

FIELD OF THE INVENTION

This invention relates, in general, to semiconductor components and, more particularly, to the protection of semiconductor components from transient electrical signals.

BACKGROUND OF THE INVENTION

Semiconductor component manufacturers typically include structures for protecting their devices against failure caused by large transient electrical stimuli. When the stimulus is an electrostatic discharge (ESD) event, manufacturers generally incorporate protection structures that account for failure mechanisms attributed to the Human Body Model (HBM) and to the Charged Device Model (CDM). The Human Body Model simulates electrostatic discharge from a human body to a semiconductor device that is sensitive to the discharge event. Here, charge accumulated on the human body discharges to the semiconductor device. The Charged Device Model simulates the discharge of charge accumulated on the semiconductor device itself during the assembly process. When these charged devices contact metal objects, a discharge event occurs which is short in duration accompanied by peak currents capable of exceeding ten amperes.

To protect against these events, semiconductor component manufacturers incorporate primary and secondary clamping structures into their components. The primary clamping structures protect against high voltage discharge events associated with contact by humans or other charged materials. They are coupled to input and output pads of the semiconductor devices to prevent device failure due to positive and negative voltage excursions. The secondary clamping structures protect against the high currents generated by discharge events associated with the semiconductor component contacting metal objects. They also protect against damage caused by large positive and negative voltage excursions. These structures are coupled to the input and output bond pads through a resistor, which lowers the voltage created by the large transient current. In addition to being coupled between the input or output bond pads, the resistance couples the primary clamping structure to the secondary clamping structure. A drawback of including this resistor is that it has a fixed resistance value that must be kept low for use in high frequency or radio frequency applications. If the resistance value is too high, the Resistance-Capacitance (RC) time constant of the pin coupled to the bond pad makes the device unacceptably slow. However, when the resistance is too low, the voltage drop across the resistor is too low to provide adequate ESD protection for the semiconductor device.

Accordingly, what is needed is a semiconductor component having a protection structure and method capable of protecting against large transient electrical stimuli, wherein the protection structure and method include an element that does not degrade the high frequency performance of the semiconductor component while providing sufficient device protection.

SUMMARY OF THE INVENTION

The present invention satisfies the foregoing need by providing a semiconductor component having a tuned variable resistance resistor and methods for manufacturing the semiconductor component. In accordance with one aspect, the present invention comprises a method for manufacturing a semiconductor component hardened to a transient electrical signal. The method includes providing a semiconductor substrate having a semiconductor device formed therefrom, wherein the semiconductor device has a device node. A first input/output node is coupled to the device node via a tuned variable resistance resistor.

In accordance with another aspect, the present invention comprises a method for protecting a semiconductor component from a transient electrical signal by coupling a tuned dynamic resistance to at least one device. The tuned dynamic resistance operates at its saturation current during an electrostatic discharge event.

In accordance with another aspect, the present invention comprises a semiconductor component having an input/output node coupled to a device node via a tuned dynamic resistance. The length of the tuned dynamic resistance is selected so that it can carry a predetermined stress current and develop a predetermined voltage thereacross in the event of a transient electrical stimulus.

BRIEF DESCRIPTION OF THE DRAWING

The present invention will be better understood from a reading of the following detailed description, taken in conjunction with the accompanying drawing figures, in which like reference numbers designate like elements and in which:

FIG. 3 is a top view of a tuned variable resistance resistor in accordance with an embodiment of the present invention;

FIG. 4 is a cross-sectional side view of the tuned variable resistance resistor taken along section line 4—4 of FIG. 3;

FIG. 5 is a schematic diagram of a semiconductor component having a tuned variable resistance resistor in accordance with an embodiment of the present invention; and FIG. 6 is a schematic diagram of a semiconductor component having a tuned variable resistance resistor in accordance with another embodiment of the present invention.

DETAILED DESCRIPTION

Generally, the present invention provides a semiconductor component having a tuned variable resistance resistor for protecting against a transient electrical signal such as, for example, an ESD event. The tuned variable resistance resistor has a low resistance value, e.g., 1 Ohm ($\Omega$)–10$\Omega$, in the absence of a large transient electrical signal and a high resistance value, e.g., 50$\Omega$–200$\Omega$ in the presence of a large transient electrical signal. Semiconductor components having tuned variable resistance resistors are hardened to ESD events and are suitable for use in low frequency and high frequency applications. During normal operation, the resistance value is sufficiently low that high frequency performance is not degraded. During an ESD event, on the other hand, the resistance value of the tuned variable resistance resistor increases to prevent the device from becoming damaged. This protects the semiconductor component and ensures reliable operation should an ESD event occur.

Figure 1:
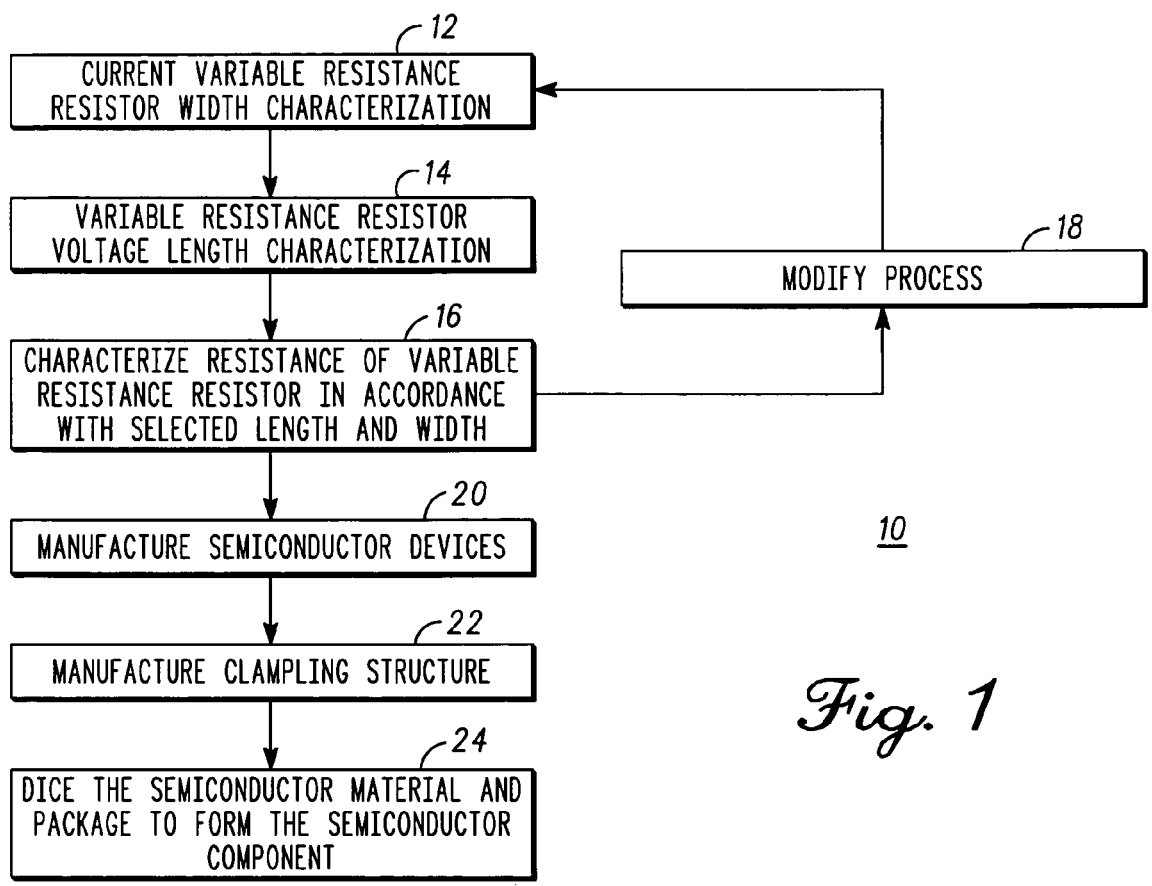
FIG. 1 is a flow diagram of a method for manufacturing a semiconductor component having a tuned variable resistance resistor in accordance with an embodiment of the present invention.

FIG. 1 is a flow chart 10 of a method for manufacturing a semiconductor component in accordance with an embodiment of the present invention. The method includes pre-manufacturing stages or process characterization steps. In one process characterization step (identified by box 12), the current-width relationship of a variable resistance resistor is characterized. More particularly, a set of variable resistance resistors is manufactured having lengths of equal value but different widths. The width of each variable resistance resistor is substantially uniform along the length of the resistor. In other words, each variable resistance resistor in the set has the same length but a different width. A series of currents is injected through each variable resistance resistor and the resulting voltage for each current is recorded. A minimum stress current level that causes failure of the variable resistance resistor is determined. Thus, each variable resistance resistor is characterized by the maximum current it can sustain for a given width.

In another process characterization step (identified by box 14), a plurality of variable resistance resistors having different lengths, but the same widths, is manufactured. The widths are selected in accordance with the maximum expected stress current the tuned variable resistance resistor may have to sustain. The voltage developed across each variable resistance resistor is measured and used to generate characterization data of the relation between resistor length and the voltage across the resistor for a predetermined stress current. This data is used in conjunction with the data from the step represented by box 12 to select the length and width of a variable resistance resistor capable of supporting a stress current of a predetermined amperage.

In this characterization step, unlike the characterization step described with reference to box 12, each variable resistance resistor has a different length. The purpose of this step is to characterize the voltage that will be developed across a predetermined length of the variable resistance resistor when the maximum expected stress current flows through it. Preferably, in each application a variable resistance resistor is designed such that its width is selected to be the minimum necessary to support a predetermined maximum current and its length is selected to support a sufficient voltage drop to trigger a primary clamp in the event of a transient electrical signal such as, for example, an electrostatic discharge (ESD) event. The primary clamp will be further described with reference to FIGS. 5 and 6.

In the next characterization step (represented by box 16), a variable resistance resistor having the desired lengths and widths is selected and the current-voltage relationship of the resistor is characterized. In this step, a tuned variable resistance resistor having the desired length and width is manufactured and the current-voltage characteristics are determined by injecting a series of currents through the resistor and measuring the resulting voltages developed along the resistor. The series of injected currents ranges in value from substantially zero current to the stress current level that is sufficient to cause the resistor to fail. The resistance of the resistor can be determined from the current-voltage characteristics. This step is important to ensure the resistance properties of the tuned variable resistance resistor are suitable for the desired application. For example, if the tuned variable resistance resistor is to be used in an ESD protection structure for a thermal diode, the performance at the output pin of the thermal diode may be sensitive to the resistance coupled to it. Thus, it is desirable to characterize this resistance. If the low-current resistance is too high for the desired application, the resistor fabrication process can be modified to change the low-current value of the tuned variable resistance resistor (identified by box 18 of FIG. 1). For a tuned variable resistance resistor comprising polysilicon, the resistance can be altered by changing the doping levels in the polysilicon. If the process is changed, the characterization steps beginning with the step identified by box 12 should be repeated.

Figure 2:
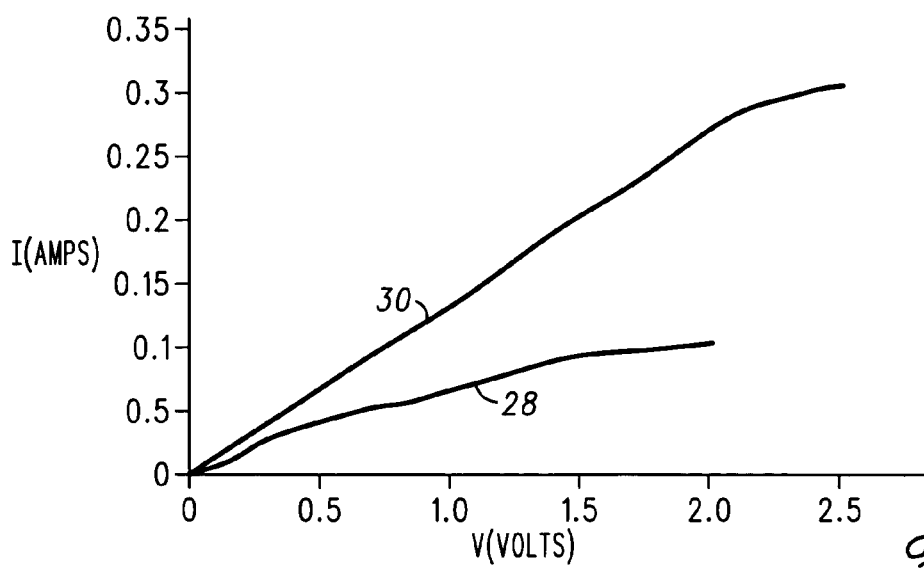
FIG. 2 is a plot of the current-voltage relationship for use in manufacturing the semiconductor component having the tuned variable resistance resistor in accordance with the present invention.

Briefly referring to FIG. 2, a plot 26 of the current through the variable resistance resistor versus the voltage across the variable resistance resistor is illustrated. The graph illustrates two current-voltage plots identified by reference numbers 28 and 30. Current-voltage plot 28 represents the current-voltage characteristics for a variable resistance resistor having a length of 0.45 micrometers and a width of 4.5 micrometers. Current-voltage plot 30 represents the current-voltage characteristics for a variable resistance resistor having a length of 0.45 micrometers and a width of 9.0 micrometers. Low resistance operation occurs for voltages less than about 0.5 volts and high resistance operation occurs for voltages greater than about 1.5 volts. Under normal operating conditions, the variable resistance resistor will be operating in the low resistance regime. During an ESD event, the current flowing through the variable resistance resistor is limited to its saturation current.

After characterization of the process, the semiconductor devices are manufactured from a semiconductor material (identified by box 20 of FIG. 1). Techniques for manufacturing semiconductor devices are known to those skilled in the art.

In accordance with one process flow, the clamping structures are manufactured after formation of the semiconductor devices. This step is represented by box 22 of FIG. 1. The clamping structures are ESD protection structures such as, for example, Silicon Controlled Rectifiers (SCRs), transistors, diodes, Zener diodes, or the like.

Preferably, the tuned variable resistance resistors are manufactured in conjunction with the clamping structures. However, they can also be manufactured using separate processing steps. A description of one embodiment for manufacturing the tuned variable resistance resistors is described with reference to FIGS. 3 and 4. It should be understood the order in which the process steps are performed is not a limitation of the present invention. For example, the clamping structures can be manufactured in conjunction with the semiconductor devices, before the semiconductor devices are manufactured, or after the semiconductor devices are manufactured.

The semiconductor material containing the semiconductor devices, the ESD protection structures, and the tuned variable resistance resistors is diced and packaged using techniques known in the art to complete the manufacture of the semiconductor component (represented by box 24 of FIG. 1).

FIG. 3 is a top view of a tuned variable resistance resistor 40 having a length L and a width W in accordance with an embodiment of the present invention. Tuned variable resistance resistor 40 has a resistor body 42 and two terminals. One terminal of tuned variable resistance resistor 40 has a plurality of metal contacts 44 and the other terminal of tuned variable resistance resistor 40 has a plurality of metal contacts 46. The minimum distance between contacts 44 and 46 is the length of tuned variable resistance resistor 40. The width of resistor body 42 is the width of tuned variable resistance resistor 40.

FIG. 4 is a cross-sectional side view of tuned variable resistance resistor 40 taken along section line 4—4 of FIG. 3. Tuned variable resistance resistor 40 comprises a substrate 50 on which an insulating material 52 is formed.

Substrate 50 is a semiconductor substrate such as, for example, silicon, polysilicon, Silicon-On-Insulator, compound semiconductor substrates, or the like and insulating material 52 is oxide. A layer of polysilicon 54 having a thickness ranging from about 1,000 Angstroms (Å) to about 1,500 Å is formed on oxide layer 52 to have length L and width W shown in FIG. 3. Optionally, polysilicon layer 54 can be formed as a doped layer of polysilicon or it can be doped after its formation. As discussed with reference to FIG. 1, the resistivity and the maximum saturation current can be changed by doping polysilicon layer 54. Optionally a masking layer (not shown) may be formed over the polysilicon layer 54 and an opening may be formed in the masking layer to expose a portion of the polysilicon layer. A layer of refractory metal (not shown) such as, for example, cobalt, is conformally deposited on polysilicon layer 54 or over the portion of the polysilicon layer exposed by the opening in the masking layer. The refractory metal is heated to a temperature ranging between about 400° C. and about 700° C. The heat treatment causes the cobalt to react with the silicon to form a cobalt silicide ($CoSi_2$) layer 56. By way of example, the thickness of cobalt silicide layer 56 ranges from about 50 Å to about 500 Å. Any unreacted cobalt is then removed using processes known to those skilled in the art. It should be understood that the type of silicide is not a limitation of the present invention. For example, other suitable silicides include titanium silicide, nickel silicide, platinum silicide, or the like. Tuned variable resistance resistor 40 comprises a layer of silicide and a layer of polysilicon.

A layer of dielectric material 62 having a thickness ranging from about 1,500 Å to about 2,500 Å is formed on polysilicon layer 54. Openings 64 and 66 are formed in dielectric layer 62 to expose the terminal portions of silicide layer 56 that serve as the terminals of variable resistance resistor 40. An electrically conductive material (not shown) such as, for example, tungsten, is deposited on dielectric layer 62 and in openings 64 and 66. Other suitable materials for the electrically conductive material include titanium, tantalum, titanium tungsten, or the like. The electrically conductive material is planarized using, for example, a Chemical Mechanical Polishing (CMP) technique having a high selectivity to dielectric layer 62. Thus, the planarization stops on dielectric layer 62. After planarization, the portions of the electrically conductive material remaining in openings 64 and 66 form contacts 44 and 46, respectively. The method for manufacturing tuned variable resistance resistors is not a limitation of the present invention.

Preferably, tuned variable resistance resistor 40 has a width-to-length ratio of greater than one. More preferably, tuned variable resistance resistor 40 has a width-to-length ratio of greater than about ten. Even more preferably, tuned variable resistance resistor 40 has a width-to-length ratio of greater than twenty.

Referring now to FIG. 5, a schematic diagram of a thermal diode protection circuit 100 in accordance with an embodiment of the present invention is illustrated. Thermal diode protection circuit 100 comprises a thermal diode 102, tuned variable resistance resistors 106 and 110, and ESD protection structures 116, 120, 130, and 134. What is shown in FIG. 5 is thermal diode 102 having an anode coupled to an anode pad 104 via tuned variable resistance resistor 106. A cathode of thermal diode 102 is coupled to a cathode pad 108 via tuned variable resistance resistor 110. Anode and cathode pads 104 and 108 are also referred to as input/output pads or component terminals.

An ESD protection structure 116 is coupled to node 114, which node 114 is formed by the connection of one terminal of tuned variable resistance resistor 106 to pad 104. An ESD protection structure 120 is coupled to the other terminal of tuned variable resistance resistor 106 and to the anode of thermal diode 102. Tuned variable resistance resistor 106 is also referred to as a tuned dynamic resistance.

An ESD protection structure 130 is coupled to node 132, which node 132 is formed by the connection of one terminal of tuned variable resistance resistor 110 to pad 108. An ESD protection structure 134 is coupled to node 136, which node 136 is formed by the connection of the other terminal of tuned variable resistance resistor 110 and the cathode of thermal diode 102. ESD protection structures 116 and 130 are referred to as primary ESD protection structures or primary clamping circuits, whereas ESD protection structures 120 and 134 are referred to as secondary ESD protection structures or secondary clamping circuits.

ESD protection structure 116 comprises a clamping circuit 140 coupled between a first source of operating potential such as, for example, $V_{DD}$, and node 114 and a clamping circuit 142 coupled between node 114 and a source of operating potential such as, for example, $V_{SS}$. Clamping circuit 140 protects structures connected to pad 104 from damage caused by positive voltage excursions in accordance with the Human Body Model (HBM) and clamping circuit 142 protects these structures from damage caused by negative voltage excursions in accordance with the Human Body Model. Likewise, ESD protection structure 130 comprises a clamping circuit 144 coupled between source of operating potential $V_{DD}$ and node 132 and a clamping circuit 146 coupled between node 132 and source of operating potential $V_{SS}$. Clamping circuit 144 protects against damage caused by positive voltage excursions in accordance with the Human Body Model (HBM) and clamping circuit 146 protects against damage caused by negative voltage excursions in accordance with the Human Body Model.

ESD protection structure 120 comprises a clamping circuit 150 coupled between source of operating potential $V_{DD}$ and node 122 and a clamping circuit 152 coupled between node 122 and source of operating potential $V_{SS}$. Clamping circuit 150 protects structures coupled to pad 104 from damage caused by negative voltage excursions in accordance with the Charged Device Model and clamping circuit 152 protects those structures from damage caused by positive voltage excursions in accordance with the Charged Device Model. Likewise, ESD protection structure 134 comprises a clamping circuit 154 coupled between source of operating potential $V_{DD}$ and node 136 and a clamping circuit 156 coupled between node 136 and source of operating potential $V_{SS}$. Clamping circuit 154 protects against damage caused by negative voltage excursions in accordance with the CDM model and clamping circuit 156 protects against damage caused by positive voltage excursions in accordance with the CDM model.

Alternatively, the ESD protection structure for thermal diode 102 may comprise primary ESD protection structures 116 and 130 instead of both primary (116 and 130) and secondary (120 and 134) ESD protection structures.

In operation, anode pad 104 and cathode pad 108 are coupled to current sensing elements (not shown), thereby forming a temperature sensing circuit. Under normal operating conditions, tuned variable resistance resistors 106 and 110 have a resistance ranging between about 1Ω and about 10Ω. During high frequency operation, these resistance values are sufficiently small that they do not affect the ideality factor of thermal diode 102. Thus, they do not degrade the high frequency performance of semiconductor component 100. However, when a large transient electrical signal such as one caused by an ESD discharge event appears on pad 104 and induces a stress current to flow, the resistance of tuned variable resistance resistor 106 increases to a value ranging from about 50Ω to about 200Ω. Because variable resistance resistor 106 is tuned, a sufficient voltage develops across it to trigger or activate primary ESD protection structure 116 before secondary ESD protection structure 120 or thermal diode 102 are damaged. Further, tuning variable resistance resistor 106 allows it to conduct the stress current caused by the ESD event without becoming damaged. Similarly, variable resistance resistor 110 is tuned such that when a large transient electrical signal appears at pad 108 and induces a stress current to flow, the resistance of tuned variable resistance resistor 110 increases from between about 1Ω and about 10Ω to between about 50Ω and about 200Ω. Tuning variable resistance resistor 110 allows it to conduct the stress current without becoming damaged and ensures the voltage developed across resistor 110 is sufficient to trigger ESD protection structure 130 before ESD protection structure 134 or thermal diode 102 are damaged.

FIG. 6 is a schematic diagram of a semiconductor circuit 200 having a tuned variable resistance resistor 202 in accordance with another embodiment of the present invention. What is shown in FIG. 6 is a bond pad 204 coupled to a semiconductor structure 206 through tuned variable resistance resistor 202. By way of example, semiconductor structure 206 is an inverter. Tuned variable resistance resistor 202 is also referred to as a tuned dynamic resistance. Inverter 206 comprises of a P-channel insulated gate field effect transistor 210 coupled to an N-channel insulated gate field effect transistor 212. A source terminal of transistor 210 is coupled for receiving source of operating potential $V_{DD}$ and its drain terminal is connected to the drain terminal of transistor 212. The source terminal of transistor 212 is coupled for receiving source of operating potential $V_{SS}$. The gate terminals of transistors 210 and 212 are commonly connected to each other and to a terminal of tuned variable resistance resistor 202 at node 214. It should be understood that the type of circuit connected to the terminal of tuned variable resistance resistor 202 at node 214 is not a limitation of the present invention. Other suitable circuits include pass gates, open-drain drivers, CMOS output drivers, Radio Frequency (RF) receivers, and RF amplifiers. The other terminal of tuned variable resistance resistor 202 is connected to bond pad 204 through node 216.

An ESD protection structure 220 is coupled to node 216 and an ESD protection structure 222 is coupled to node 214. In accordance with one embodiment, ESD protection structure 220 comprises a clamping circuit 224 coupled between source of operating potential $V_{DD}$ and node 216 and a clamping circuit 226 coupled between node 216 and source of operating potential $V_{SS}$. Clamping circuit 224 protects the structures coupled to bond pad 204 from damage caused by positive voltage excursions in accordance with the Human Body Model (HBM) and clamping circuit 226 protects structures coupled to bond pad 204 from damage caused by negative voltage excursions in accordance with the Human Body Model.

Secondary ESD protection structure 222 comprises a clamping circuit 228 coupled between source of operating potential $V_{DD}$ and node 214 and a clamping circuit 230 coupled between node 214 and a source of operating potential such as, for example, $V_{SS}$. Clamping circuit 228 protects against damage caused by negative voltage excursions in accordance with the Charged Device Model and clamping circuit 230 protects against damage caused by positive voltage excursions in accordance with the Charged Device Model.

Under normal operating conditions, tuned variable resistance resistor 202 has a resistance value ranging from about 1Ω to about 10Ω. During high frequency operation, this resistance is sufficiently small that it does not create a large Resistance-Capacitance (RC) time delay through bond pad 204. Thus, tuned variable resistance resistor 202 does not degrade the high frequency performance of semiconductor circuit 200. However, when a large transient electrical signal such as one caused by an ESD discharge event appears on bond pad 204 and induces a stress current to flow, the resistance of tuned variable resistance resistor 202 increases to between about 50Ω and about 200Ω. Because variable resistance resistor 202 is tuned, the voltage developed across it is sufficient to trigger ESD protection circuit 220 before ESD protection circuit 222 or elements of inverter 206 such as, for example, the gate oxide of the input receiver circuit, are damaged. In addition, tuning variable resistance resistor 202 allows it to conduct the stress current associated with the ESD event without being damaged.

Alternatively, the ESD protection structure for semiconductor structure 206 may comprise primary ESD protection structure 220 instead of both primary (220) and secondary (222) ESD protection structures.

By now it should be appreciated that a semiconductor component having a tuned variable resistance resistor and a method for protecting against large transient electrical signals have been provided. The tuned variable resistance resistor has a low resistance value under normal operating conditions and a high resistance value in the event a large transient electrical signal, such as an ESD event, occurs. An advantage of the tuned variable resistance resistor having a dynamic resistance value is that its resistance is sufficiently low under normal conditions to be incorporated into circuits used in high frequency and low frequency applications. Yet, the resistance of the tuned variable resistance resistor increases in the event of a transient electrical signal such as a voltage or current spike. Thus, the versatility and robustness of circuits including this element are increased. In addition, the tuned variable resistance resistor lowers the cost of manufacturing semiconductor components because it is optimized for size, which decreases the amount of semiconductor material consumed by the resistor. Tuning further allows setting a desired current the circuit must sustain such as, for example, two amperes.

Although certain preferred embodiments and methods have been disclosed herein, it will be apparent from the foregoing disclosure to those skilled in the art that variations and modifications of such embodiments and methods may be made without departing from the spirit and scope of the invention. For example, the semiconductor component may have primary clamping structures but no secondary clamping structures. It is intended that the invention shall be limited only to the extent required by the appended claims and the rules and principles of applicable law.

What is claimed is:

1. A method for protecting a semiconductor component from a transient electrical signal, comprising:

characterizing the current-width relationship of a first plurality of variable resistance resistors to determine a stress current level sufficient to cause failure of one or more resistors of the first plurality of variable resistance resistors;

characterizing the voltage-length relationship of a second plurality of variable resistance resistors to determine a voltage across the resistors of the second plurality of variable resistance resistors in response to the stress current level;

characterizing a current-voltage relationship of a selected variable resistance resistor having a selected length and width, wherein the variable resistance resistor serves as a tuned variable resistance resistor;

providing a semiconductor device having a device node;

providing a first input/output node;

coupling the device node to the first input/output node with the tuned variable resistance resistor having the selected length and width; and operating the tuned variable resistance resistor in a first operating mode in the absence of the transient electrical signal and in a second operating mode in the presence of the transient electrical signal.

2. The method of claim 1, wherein:

characterizing the current-width relationship of the first plurality of variable resistance resistors comprises fabricating the resistors of the first plurality of variable resistance resistors to have the same lengths but different widths, wherein the width of each resistor is substantially uniform along its length; and wherein characterizing the voltage-length relationship of the second plurality of variable resistance resistors comprises fabricating the resistors of the second plurality of variable resistance resistors to have the same widths but different lengths, wherein the widths are selected in accordance with the stress current level; and wherein characterizing the current-voltage relationship of the selected variable resistance resistor comprises injecting a series of currents through the selected variable resistance resistor and measuring the resulting voltages across the selected variable resistance resistor, wherein the series of currents ranges from substantially zero current to the stress current level sufficient to cause its failure.

3. The method of claim 2, further including coupling a semiconductor structure to the tuned variable resistance resistor, the semiconductor structure selected from the group of semiconductor structures consisting of a thermal diode, a pass gate, an open-drain driver circuit, a CMOS output driver circuit, a radio frequency receiver, a radio frequency amplifier, and an inverter circuit.

4. The method of claim 2, further including coupling a first clamping structure to the first input/output node.

5. The method of claim 4, wherein coupling the first clamping structure comprises coupling a first clamping circuit between the first input/output node and one of first and second sources of operating potential.

6. The method of claim 5, wherein coupling the first clamping structure comprises coupling a second clamping circuit between the first input/output node and one of the other of the first and second sources of operating potential.

7. The method of claim 4, further including coupling a second clamping structure to the device node.

8. The method of claim 1, wherein coupling the device node to the input/output node comprises:

forming a layer of dielectric material over a semiconductor substrate;

forming a layer of polysilicon over the layer of dielectric material; and forming a silicide layer from a portion of the layer of polysilicon.

9. The method of claim 8, wherein:

characterizing the current-width relationship of the first plurality of variable resistance resistors comprises fabricating the resistors of the first plurality of variable resistance resistors to have the same lengths but different widths, wherein the width of each resistor is substantially uniform along its length; and wherein characterizing the voltage-length relationship of the second plurality of variable resistance resistors comprises fabricating the resistors of the second plurality of variable resistance resistors to have the same widths but different lengths, wherein the widths are selected in accordance with the stress current level; and wherein characterizing the current-voltage relationship of the selected variable resistance resistor comprises injecting a series of currents through the selected variable resistance resistor and measuring the resulting voltages across the selected variable resistance resistor, wherein the series of currents ranges from substantially zero current to the stress current level sufficient to cause its failure.

10. The method of claim 8, further including forming a first contact at a first end of the layer of polysilicon and a second contact at a second end of the layer of polysilicon, wherein a distance between the first and second contacts is the length of the tuned variable resistance resistor, and wherein a width of the layer of polysilicon is a width of the tuned variable resistance resistor.

11. The method of claim 10, wherein a width-to-length ratio of the tuned variable resistance resistor is greater than one.

12. The method of claim 11, wherein the width-to-length ratio of the tuned variable resistance resistor is greater than twenty.

13. The method of claim 1, wherein the semiconductor device comprises a thermal diode having an anode terminal and a cathode terminal, and wherein one of the anode terminal and the cathode terminal is coupled to the device node.

14. The method of claim 13, further including:

forming a second input/output node; and coupling the one of the anode and the cathode that is uncoupled from the device node to the second input/output node with another tuned variable resistance.

15. The method of claim 14, wherein the another tuned variable resistance comprises silicide and polysilicon.

16. The method of claim 1, wherein operating the tuned variable resistance resistor in the first operating mode comprises operating the tuned variable resistance resistor in a linear operating mode and operating the tuned variable resistance resistor in the second operating mode comprises operating the tuned variable resistance resistor in a saturation mode.

17. The method of claim 16, further including selecting the stress current in accordance with the width of the tuned variable resistance resistor and selecting the resistance in accordance with the length of the tuned variable resistance resistor.

18. The method of claim 16, further including adjusting the length and width of the tuned variable resistance resistor in accordance with a saturation current.

19. A method for protecting a semiconductor component from a transient electrical signal, comprising:

providing a semiconductor device having a device node;

providing a first input/output node;

coupling the device node to the first input/output node with a tuned variable resistance resistor having a length and width, wherein coupling the device node to the input/output node comprises:
  forming a layer of dielectric material over a semiconductor substrate;
  forming a layer of polysilicon over the layer of dielectric material; and
  forming a silicide layer from a portion of the layer of polysilicon, wherein forming the silicide layer comprises:
    forming a masking layer over the layer of polysilicon, the masking layer having an opening exposing a portion of the layer of polysilicon;
    forming a layer of refractory material over the exposed portion of the layer of polysilicon; and
    heating the layer of polysilicon and the layer of refractory material; and
  operating the tuned variable resistance resistor in a first operating mode in the absence of the transient electrical signal and in a second operating mode in the presence of the transient electrical signal.

20. A method for protecting a semiconductor component from an Electro-Static Discharge ("ESD") event, comprising:
  characterizing the current-width relationship of a first plurality of dynamic resistances to determine a stress current level sufficient to cause failure of one or more dynamic resistances of the first plurality of dynamic resistances;
  characterizing the voltage-length relationship of a second plurality of dynamic resistances to determine a voltage drop across the resistances of the second plurality of dynamic resistances in response to the stress current level;
  characterizing a current-voltage relationship of a selected dynamic resistance having a selected length and width, wherein the dynamic resistance serves as a tuned dynamic resistance;
  providing a semiconductor device having at least one device terminal;
  coupling the at least one device terminal to a component terminal via the tuned dynamic resistance; and
  operating the tuned dynamic resistance in a linear operating mode in the absence of the ESD event and in a saturation operating mode in the presence of the ESD event.

21. The method of claim 20, wherein providing the semiconductor device comprises providing a semiconductor device selected from the group of semiconductor devices consisting of a thermal diode, a pass gate, an open-drain driver, a CMOS output driver, a radio frequency receiver, and a radio frequency amplifier.

22. The method of claim 20, wherein:
  characterizing the current-width relationship of the first plurality of dynamic resistances comprises fabricating the dynamic resistances of the first plurality of dynamic resistances to have the same lengths but different widths, wherein the width of each dynamic resistance is substantially uniform along its length; and wherein
  characterizing the voltage-length relationship of the second plurality of dynamic resistances comprises fabricating the dynamic resistances of the second plurality of dynamic resistances to have the same widths but different lengths, wherein the widths are selected in accordance with the stress current level; and wherein
  characterizing the current-voltage relationship of the selected dynamic resistance comprises injecting a series of currents through the selected dynamic resistance and measuring the resulting voltages across the selected dynamic resistance, wherein the series of currents ranges from substantially zero current to the stress current level sufficient to cause its failure.

23. The method of claim 22, further including:
  coupling a first clamping structure between the at least one device terminal and a first source of operating potential;
  coupling a second clamping structure between the component terminal and one of the first or second sources of operating potential; and
  wherein coupling the at least one device terminal to a component terminal includes forming the tuned dynamic resistance to have a width capable of supporting a stress current level equal to a saturation current of the tuned dynamic resistance and forming the tuned dynamic resistance to have a length such that a transient electrical signal activates the first clamping structure before the transient electrical signal damages the second clamping structure or the semiconductor device.

24. The method of claim 20, wherein coupling the at least one device terminal to the at least one component terminal comprises:
  forming a layer of polysilicon; and
  forming silicide from the layer of polysilicon, the silicide having a rectangular shape with a width-to-length ratio of greater than ten.

25. The method of claim 24, further including doping the layer of polysilicon with an impurity material.

26. The method of claim 20, wherein in the linear operating mode the tuned dynamic resistance has a value ranging between about 1Ω and about 10Ω.

27. The method of claim 20, wherein in the saturation operating mode the tuned dynamic resistance has a value ranging between about 50Ω and about 200Ω.

* * * * *